United States Patent
Sharan

(10) Patent No.: US 7,527,722 B2
(45) Date of Patent: May 5, 2009

(54) ELECTROCHEMICAL MECHANICAL PLANARIZATION

(75) Inventor: Sujit Sharan, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 10/666,476

(22) Filed: Sep. 19, 2003

(65) Prior Publication Data
US 2004/0060814 A1 Apr. 1, 2004

Related U.S. Application Data

(63) Continuation of application No. 09/968,466, filed on Sep. 28, 2001, now Pat. No. 6,706,158.

(51) Int. Cl.
B23H 5/06 (2006.01)
B23H 3/04 (2006.01)

(52) U.S. Cl. ............................ 205/662; 204/229.4

(58) Field of Classification Search ............ 204/217, 204/229.4; 451/41; 205/662
See application file for complete search history.

(56) References Cited

U.S. PATENT DOCUMENTS 5,807,165 A * 9/1998 Uzoh et al. .................. 451/41
6,176,992 B1 1/2001 Talieh
6,234,752 B1 * 5/2001 Wei et al. .................. 416/96 R
6,402,925 B2 6/2002 Talieh
6,413,403 B1 7/2002 Lindquist et al.
6,464,855 B1 10/2002 Chadda et al.
6,572,755 B2 * 6/2003 Emesh et al. ............... 205/137
6,767,427 B2 * 7/2004 Walters et al. ......... 156/345.12
7,074,113 B1 * 7/2006 Moore ......................... 451/28
2003/0040830 A1 * 2/2003 Parikh et al. ................ 700/121

* cited by examiner

*Primary Examiner*—Harry D. Wllkins, III
*Assistant Examiner*—Nicholas A. Smith
(74) *Attorney, Agent, or Firm*—George Chen

(57) ABSTRACT

The present invention discloses an apparatus having a platen; a polishing pad disposed over the platen; a slurry dispenser disposed over the polishing pad; a cathode connected electrically to the polishing pad; a wafer carrier disposed over the polishing pad;
an anode connected electrically to the wafer carrier; and a power supply connected to the anode and the cathode.

The present invention further discloses a method to remove a surface layer from a wafer using a polishing pad, a slurry, and an electrical current.

15 Claims, 2 Drawing Sheets

ELECTROCHEMICAL MECHANICAL PLANARIZATION

This is a Continuation application of Ser. No. 09/968,466, filed Sep. 28, 2001, now U.S. Pat. No. 6,706,158 B2.

BACKGROUND OF THE INVENTION

1. Field of the Invention

The present invention relates to the field of semiconductor integrated circuit manufacturing, and more specifically, to an apparatus for and method of polishing.

2. Discussion of Related Art

During Integrated Circuit (IC) manufacturing, devices are formed by deposition, patterning, and selective removal of various layers on a semiconductor substrate, such as a Silicon wafer. For example, a conductive structure, such as an interconnect, is formed from a metallic layer while an insulative structure, such as isolation for the interconnect, is formed from a dielectric layer.

Planarization of the surface of a wafer is necessary in order to achieve an adequate depth of focus (DOF) for patterning by lithography. The layers on a wafer may be planarized by chemical mechanical polishing (CMP). The process of CMP combines chemical etching with mechanical lapping. For example, CMP may involve polishing of a metal that has been deposited on a barrier layer over insulation. The metal is relatively soft while the barrier layer is relatively hard.

Polish selectivity may be changed by adjusting the polish rates of different materials. It is desirable to achieve a low polish selectivity between the metal and the barrier layer to avoid dishing. It is also desirable to achieve a high polish selectivity between the metal and the insulation to avoid erosion. The high selectivity of the metal over the insulation allows the insulation to serve as a polish stop layer. Polish selectivity may be optimized by changing the properties of the polish pad and the composition of the polish slurry.

In advanced IC devices, the insulation is formed from a material with a low dielectric constant (low-k) rather than with Silicon Dioxide. However, a high selectivity between the metal and the low-k material becomes difficult to achieve since the low-k material usually has poor mechanical properties.

Thus, what is needed is an apparatus for and a method of improving the planarization of a surface layer.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

In electrochemical mechanical planarization (EMP), a surface layer on a substrate is flattened and smoothened by application of a combination of mechanical forces, chemical reactions, and electrochemical reactions. The present invention relates to an apparatus for and a method of planarizing a surface with EMP.

Figure 1:
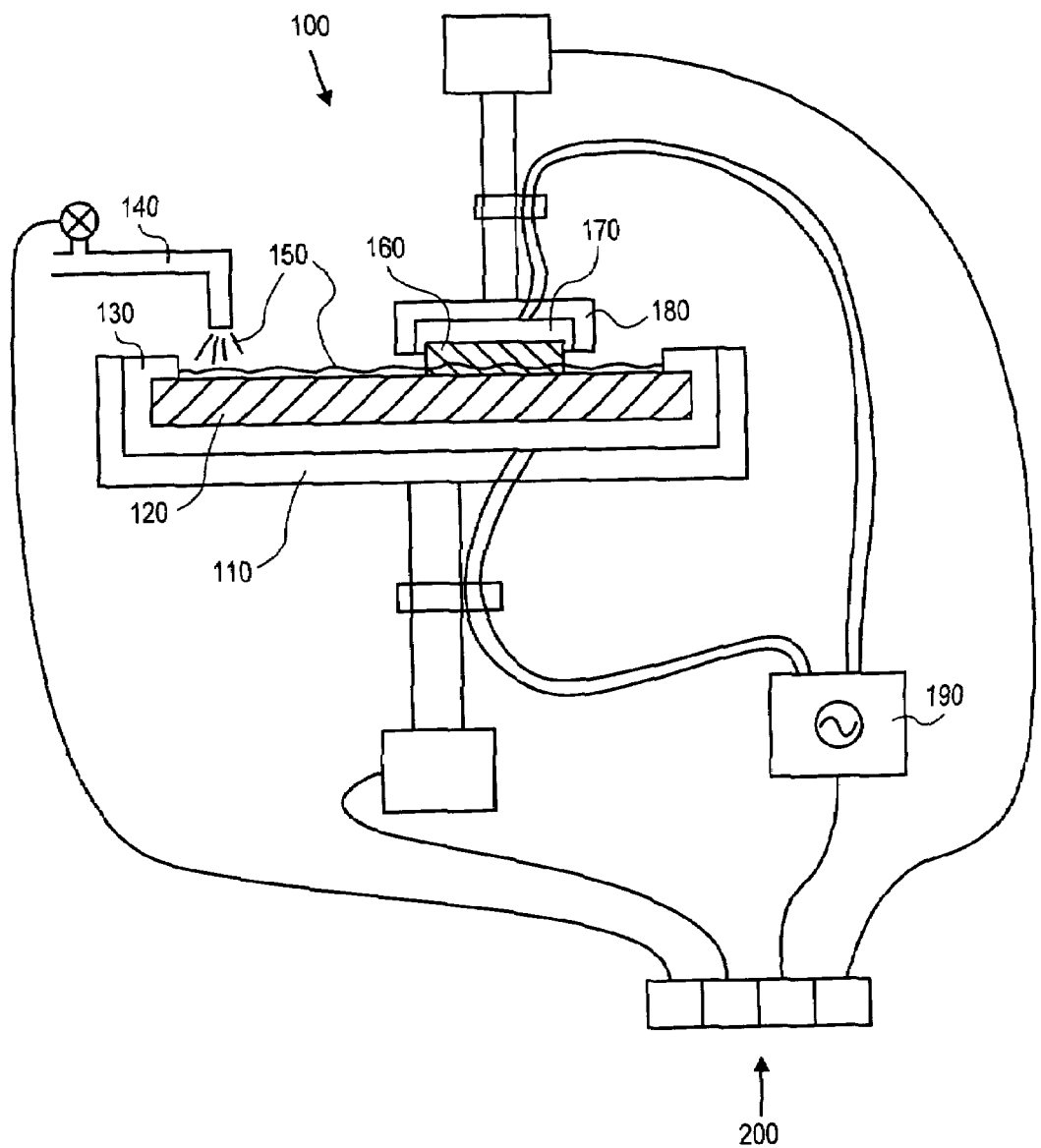
FIG. 1 is an illustration of a cross-sectional view of an embodiment of an apparatus for electrochemical mechanical polishing according to the present invention.

An embodiment of an apparatus for EMP is shown in FIG. 1. An EMP tool 100 may include a platen 110 or a track (not shown). The platen 110 is capable of a range of circular and linear motion, such as revolution, rotation, lateral translation, or vertical translation. The motion may be more complex, such as planetary motion. The platen 110 may be maintained at a certain temperature by circulating a fluid in coils within the platen 110 and through a chiller or heater (not shown).

A polishing pad 120 may be located over the platen 110. The polish rate and the polish selectivity depend on the properties of the polishing pad 120, such as hardness, stiffness, porosity, abrasiveness, and absorbance. Hardness affects the life of the polishing pad 120. Stiffness affects the flexibility of the polishing pad 120 in conforming to the shape of a wafer 160 that is being planarized. Porosity affects the contact area between the polishing pad 120 and the wafer 160. Abrasiveness affects the removal rate of material from the surface of the wafer 160. Absorbance affects the amount of slurry 150 that is retained within the polishing pad 120. The polishing pad 120 may have channels to facilitate movement of slurry 150 between the polishing pad 120 and the wafer 160.

A cathode 130 may be placed in electrical contact with the polishing pad 120. In one embodiment, the cathode 130 may be located towards the periphery of the platen 110. The cathode 130 may be segmented in order to improve the distribution of current across the polishing pad 120. In another embodiment, the cathode 130 may be located between the platen 110 and the polishing pad 120. The cathode 130 is connected to a power supply 190.

In situations where the electrochemical reactions during EMP may evolve hydrogen at the cathode, the EMP tool 100 must include an enclosure with adequate ventilation and exhaust to address safety and environmental concerns.

A slurry dispenser 140 may be located over the polishing pad 120 to provide slurry 150, either continuously or intermittently. The dispenser 140 may be capable of a range of motion while supplying the slurry 150. The slurry 150 may be conditioned and sprayed in a certain pattern if desired. The polish rate and the polish selectivity depend on the composition of the slurry 150. The slurry 150 may include abrasive particles, such as alumina or silica, and may be maintained at a certain pH and temperature. For example, the slurry may be acidic. In one embodiment, the slurry 150 has a pH of 2.0-3.0. In another embodiment, the slurry 150 has a pH of 1.0-1.5. The slurry may include an oxidizer.

A substrate, such as a wafer 160, may be placed in contact with the polishing pad 120 and the slurry 150. The slurry 150 may be partly absorbed within the polishing pad 120.

An anode 170 may be in electrical contact with a wafer 160. In one embodiment, the anode 170 may be located towards the periphery of the wafer holder 180 if a surface layer on the wafer is continuous and conductive. The anode 170 may be segmented in order to improve the distribution of current across the wafer 160. In another embodiment, the anode 170 may be located between the wafer 160 and the wafer carrier 180 if the body of the wafer 160 itself is conductive. The anode 170 is connected to the power supply 190.

The wafer 160 is mounted in a wafer carrier (head) 180. The wafer 160 may be held in various ways, such as by vacuum, friction, surface tension, or electrostatic forces. The wafer carrier 180 can vary the pressure of the wafer 160 on the polishing pad 120 and the slurry 155. The wafer carrier 180 is capable of a range of circular and linear motion, such as revolution, rotation, lateral translation, or vertical translation. The motion may be more complex, such as planetary motion. Movement of the wafer carrier 180, in conjunction with movement of the platen 110, will affect mass transfer of the slurry 150 during EMP. The wafer carrier 180 may be maintained at a certain temperature by circulating a fluid in coils within the wafer holder and through a chiller or heater (not shown).

During the operation of an EMP tool 100, the polishing pad 120 is electrically connected to the cathode 130 while the wafer 160 is electrically connected to the anode 170. The polishing pad 120 may be electrically conductive or insulating. One embodiment involves the addition of an electrically conductive ring (may be segmented) around the polishing pad 120. Another embodiment involves the addition of an electrically conductive underlayer below the polishing pad 120. The slurry 150 completes the electrical circuit when the power supply 190 applies a voltage or current between the polishing pad 120 and the wafer 160.

A computer 200 may be used to monitor and control critical components and parameters of an EMP tool 100, such as the movement of the platen 110, the movement of the wafer carrier 180, the movement of the slurry dispenser 140, the dispensing of the slurry 150, the voltage and current delivered by the power supply 190, the current density across the polishing pad 120, and the current density across the wafer 160. If desired, the temperature of the platen 110 and the temperature of the wafer carrier 180 may be controlled within appropriate ranges.

As appropriate, one or more loops may be included for feedforward or feedback control of the electrochemical process. For example, the computer 200 may vary the voltage or the current as a function of time (such as pulsing on and off, temperature, process parameter (such as slurry 150 flowrate), or EMP tool 100 parameter (such as speed of rotation of the platen 110 or wafer carrier 180).

In another embodiment of the present invention, EMP may be used to planarize a surface layer 240, such as metal, on a wafer 160. Planarization of a surface layer 240 is accomplished by application of a combination of mechanical forces, chemical reactions, and electrochemical reactions. The polishing rates for different materials influence the EMP selectivity and may be optimized by changing the properties of the polishing pad 120, the composition of the polish slurry 150, and the voltage or current applied between a polishing pad and a wafer by a power supply 190. In some cases, adjusting the voltage or current may affect the final surface finish of a surface layer 240, especially if the material has certain crystallographic orientations.

In some applications, the removal rate of the surface layer 240 is a function of location on the wafer 160. For example, the polish rate may be faster towards the center of the wafer 160 in comparison with the edges of the wafer 160. In order to improve uniformity of the removal, the temperature and the current density across the wafer 160 may be varied to minimize the dependency on location. Such a level of fine control will require the partitioning of the cooling/heating coils in the wafer carrier 180 and the partitioning of the anode 170 into small components that may be adjusted separately.

Figure 2A:
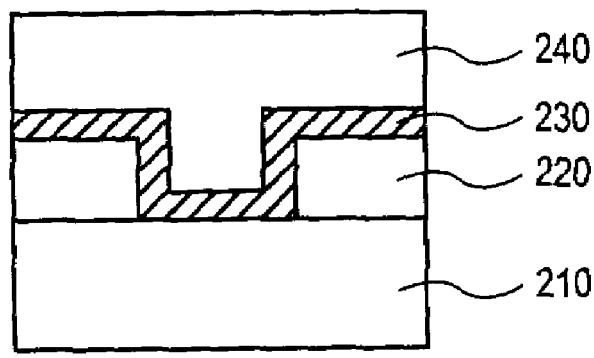
FIGS. 2(*a*)-(*c*) are illustrations of a cross-sectional view of a method to planarize interconnect according to the present invention.

EMP may be used as part of a Damascene process flow to form a metal plug 250 in a typical multilevel interconnect. A metal plug 250 provides an electrical connection between an underlying metal line 210 and an overlying metal line (not shown). An embodiment of the structure of a portion of a multilevel interconnect prior to performing EMP is shown in FIG. 2(a). The insulation 220 may be about 4,000-7,000 Angstroms thick. The barrier layer 230 may be about 150-300 Angstroms thick. The underlying metal line 210 may be about 1,500-3,000 Angstroms thick.

In one embodiment, the primary metal 240 may be Tungsten and the insulation 220 may be Silicon Dioxide. The Silicon Dioxide may be formed by chemical vapor deposition (CVD). The Silicon Dioxide may have a dielectric constant of about 4.2. The barrier layer 230 may be Titanium Nitride that is formed by CVD.

In another embodiment, the primary metal 240 may be Copper and the insulation 220 may be a low dielectric constant (low-k) material such as Fluorine-doped Silicon Oxide. The Fluorine-doped Silicon Oxide may have a dielectric constant of about 3.7. Other materials with a dielectric constant of less than 3.0 may be used for the insulation 220, but the mechanical properties are usually poorer. The barrier layer 230 may be Tantalum Nitride that is formed by sputter deposition.

Figure 2B:
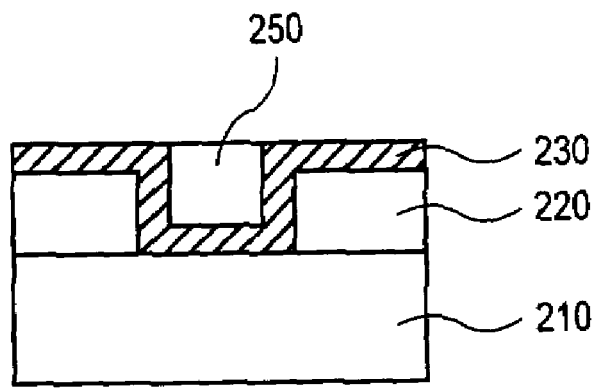

In one embodiment, EMP is done in two steps. In the first step, a primary metal 240 is polished using EMP under a first set of conditions that has high selectivity of primary metal 240 to barrier layer 230. An embodiment is shown in FIG. 2(b). The polish time may be about 120 seconds. The removal rate for Tungsten is about 1,000-1,500 Angstroms per minute. When the current density is raised, the removal rate may increase to about 2,500-3,00 Angstroms per minute. The polishing may be continued for an overpolish time, such as 15%, after detection of endpoint on the underlying thin diffusion barrier layer 230. The barrier layer 230 acts as a polish stop layer since the barrier layer 230 is usually much harder than the primary metal 240.

Figure 2C:
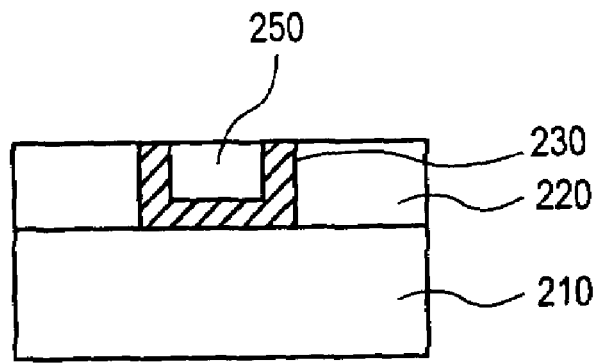

In the second step, the barrier layer 230 is polished using EMP under a second set of conditions that has a high selectivity of barrier layer 230 to insulation 220. An embodiment is shown in FIG. 2(c). The polish time may be about 30 seconds. The polishing may be continued for an overpolish time, such as 15%, after detection of endpoint on the underlying insulation 220. An embodiment is shown in FIG. 2(c). The result is a metal plug 250 surrounded by insulation 220 where the top surface of the metal plug 250 is level with the top surface of the insulation 220.

In another embodiment, EMP is done in one step (not shown) by combining the two steps described above. In this case, it is desirable to achieve a selectivity close to 1:1 between the primary metal 240 and the barrier layer 230 to avoid dishing of the primary metal 240 within wide features. It is also desirable to achieve a high selectivity, such as 100:1, between the primary metal 240 and the insulation 220 to avoid erosion of the insulation 220 in the field. The high selectivity of the primary metal 240 to the insulation 220 allows the insulation 220 to serve as a polish stop layer.

Some typical parameters for an EMP process include platen 110 rotation of about 30-50 revolutions per minute (rpm), slurry 150 flowrate of about 300 milliliters per minute, wafer carrier 180 rotation of about 100 rpm, and wafer carrier 180 pressure of about 1.5 pounds per square inch (psi).

Both the two-step process and the one-step process may be followed by a buff step to remove scratches. The buff step may be done with a softer pad. The buff step may take about 20 seconds. A post-scrub clean may be done with Ammonium Hydroxide. The pH may be about 10.0-11.0.

In another embodiment, EMP may be used as part of a Dual Damascene process flow to form a metal line and a metal plug simultaneously (not shown).

During planarization of a metal layer at the surface of a wafer 160, the flow of electric current causes metal ions from the surface of the metal layer 240 to diffuse into the slurry 150. Thus, anodic etching of the metal layer 240 occurs at the surface of the wafer 160, in addition to the polishing of the metal layer 240, so that the overall removal rate is increased. The higher points at the surface of the metal layer 240 are subject to a higher current density and are thus dissolved at a greater rate than the lower points at the surface of the metal layer 240. Consequently, the metal layer 240 is also flattened and smoothened as material is removed from the surface of the wafer 160. It may be necessary to periodically clean the cathode 130 and polishing pad 120 of the EMP tool 100 to remove any metal deposits.

Anodic etching may be adjusted to provide the desired selectivity for the removal of the surface metal layer 240 relative to the barrier layer 230 and the insulation 220. On the one hand, the metal layer 240, such as Copper, has a high polish rate so a low current density may be used. On the other hand, the barrier layer 230 has a low polish rate so a high current density may be used. The removal rate and the selectivity may be monitored in real time by measuring the current density across the wafer 160.

As appropriate, one or more loops may be included for feedforward or feedback control of the electrochemical process. For example, the voltage or the current may be varied as a function of time (such as pulsing on and off), temperature, process parameter (such as slurry 150 flowrate), or EMP tool 100 parameter (such as speed of rotation of the platen 110 or wafer carrier 180). The control of the EMP process with respect to any desired variable may include one or more of the following control methods: proportional, differential, or integral.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an apparatus for and a method of improving the planarization of a surface layer.

I claim:

1. An apparatus comprising:
   a platen;
   a polishing pad disposed over said platen;
   a segmented cathode disposed around edge of said polishing pad and between said platen and a rear surface of said polishing pad;
   a slurry disposed on said polishing pad;
   a wafer disposed on said polishing pad and said slurry, said wafer having a body that is electrically conductive;
   a wafer carrier to hold said wafer;
   a chiller or heater to circulate a fluid within said platen and within said wafer carrier;
   a segmented anode disposed between a rear surface of said body of said wafer and said wafer carrier, said segmented anode being partitioned into small components that may be electrically adjusted separately to change polishing rates and polishing selectivities for different materials in a surface layer of said wafer;
   an enclosure disposed around said platen and said wafer carrier;
   a power supply to apply a voltage or current between said segmented cathode and said segmented anode; and
   a computer to vary said voltage or said current to improve uniformity of said polishing rates and said polishing selectivities.

2. The apparatus of claim 1 wherein said surface layer of said wafer comprises a continuous and conductive surface layer.

3. The apparatus of claim 1 wherein said computer optimizes said polishing rates or said polishing selectivities for said different materials in said surface layer of said wafer by varying said voltage or said current.

4. The apparatus of claim 1 wherein said computer varies said voltage or said current as a function of time.

5. The apparatus of claim 1 wherein said computer varies said voltage or said current as a function of temperature.

6. The apparatus of claim 1 wherein said computer varies said voltage or said current as a function of process parameter.

7. The apparatus of claim 6 wherein said process parameter comprises slurry flowrate.

8. The apparatus of claim 1 wherein said computer varies said voltage or said current as a function of tool parameter.

9. The apparatus of claim 8 wherein said tool parameter comprises speed of rotation of said platen.

10. The apparatus of claim 8 wherein said tool parameter comprises speed of rotation of said wafer carrier.

11. The apparatus of claim 1 wherein said computer comprises feedforward control of an electrochemical process.

12. The apparatus of claim 1 wherein said computer comprises feedback control of an electrochemical process.

13. The apparatus of claim 1 wherein said computer comprises proportional control of said voltage or said current.

14. The apparatus of claim 1 wherein said computer comprises differential control of said voltage or said current.

15. The apparatus of claim 1 wherein said computer comprises integral control of said voltage or said current.

* * * * *